(12) United States Patent
Wang et al.

(10) Patent No.: US 11,830,774 B2
(45) Date of Patent: Nov. 28, 2023

(54) BURIED CONTACT THROUGH FIN-TO-FIN SPACE FOR VERTICAL TRANSPORT FIELD EFFECT TRANSISTOR

(71) Applicant: International Business Machines Corporation, Armonk, NY (US)

(72) Inventors: Junli Wang, Slingerlands, NY (US); Brent Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 17/482,567

(22) Filed: Sep. 23, 2021

(65) Prior Publication Data

US 2023/0088855 A1 Mar. 23, 2023

(51) Int. Cl.
*H01L 21/8234* (2006.01)
*H01L 23/528* (2006.01)
*H01L 21/74* (2006.01)
*H01L 29/66* (2006.01)

(52) U.S. Cl.
CPC .... *H01L 21/823475* (2013.01); *H01L 21/743* (2013.01); *H01L 21/823425* (2013.01); *H01L 21/823487* (2013.01); *H01L 23/5286* (2013.01); *H01L 29/66666* (2013.01)

(58) Field of Classification Search
CPC ........... H01L 21/743; H01L 21/823475; H01L 21/823871; H01L 21/823487; H01L 21/823885; H01L 29/66666; H01L 29/7827

See application file for complete search history.

(56) References Cited

U.S. PATENT DOCUMENTS

| 7,683,428 B2 | 3/2010 | Chidambarrao et al. |
| 9,680,473 B1 | 6/2017 | Anderson et al. |
| 10,103,247 B1 | 10/2018 | Xie et al. |

(Continued)

FOREIGN PATENT DOCUMENTS

CN 111968969 A 11/2020

OTHER PUBLICATIONS

Anshul Gupta et al., "High-Aspect-Ratio Ruthenium Lines for Buried Power Rail," International Interconnect Technology Conference (IITC), 2018, pp. 4-6.

(Continued)

*Primary Examiner* — Robert G Bachner
*Assistant Examiner* — Molly K Reida
(74) *Attorney, Agent, or Firm* — CANTOR COLBURN LLP; Samuel Waldbaum

(57) ABSTRACT

Embodiments of the present invention are directed to fabrication methods and resulting structures that provide buried contacts in the fin-to-fin space of vertical transport field effect transistors (VFETs) that connect the bottom S/D of the transistors to a buried power rail. In a non-limiting embodiment of the invention, a buried power rail is encapsulated in a buried oxide layer of a first wafer. First and second semiconductor fins are formed on a second wafer. The first wafer to the second wafer and a surface of the buried power rail in a fin-to-fin space is exposed. A buried via is formed on the exposed surface of the buried power rail. The buried via electrically couples the buried power rail to a bottom source or drain region of the first semiconductor fin.

14 Claims, 11 Drawing Sheets

(56) References Cited

U.S. PATENT DOCUMENTS

| | | |
|---|---|---|
| 10,325,821 B1 | 6/2019 | Hook et al. |
| 2018/0190670 A1 | 7/2018 | Ryckaert et al. |
| 2018/0294267 A1 | 10/2018 | Licausi et al. |
| 2020/0135578 A1 | 4/2020 | Ching et al. |
| 2020/0135634 A1 | 4/2020 | Chiang et al. |
| 2020/0203210 A1 | 6/2020 | Yakimets et al. |
| 2020/0373331 A1 | 11/2020 | Kim et al. |
| 2021/0280474 A1* | 9/2021 | Wang .............. H01L 21/823431 |

OTHER PUBLICATIONS

J. Ryckaert et al., "Enabling Sub-5nm CMOS Technology Scaling Thinner and Taller!," International Electron Devices Meeting (IEDM), 2019, 29.4, 4 pp.

International Search Report; International Application No. PCT/CN2022/103768; International Filing Date: Jul. 5, 2022; dated Sep. 23, 2022; 10 pages.

* cited by examiner

BURIED CONTACT THROUGH FIN-TO-FIN SPACE FOR VERTICAL TRANSPORT FIELD EFFECT TRANSISTOR

BACKGROUND

The present invention generally relates to fabrication methods and resulting structures for semiconductor devices, and more specifically, to fabrication methods and resulting structures for a vertical transport field effect transistor (VFET) having a buried contact in the fin-to-fin space that connects the bottom source/drain (S/D) and buried power rail.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, VFETs employ semiconductor fins and side-gates that can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method of forming semiconductor devices on a wafer, wherein the method provides a buried contact in the fin-to-fin space of vertical transport field effect transistors (VFETs) that connects the bottom source or drain (S/D) of the transistors to a buried power rail. A non-limiting example of the method includes forming a buried power rail in a buried oxide layer of a first wafer. First and second semiconductor fins are formed on a second wafer. The first wafer, the second wafer and a surface of the buried power rail in a fin-to-fin space are exposed. A buried via is formed on the exposed surface of the buried power rail. The buried via electrically couples the buried power rail to a bottom source or drain region of the first semiconductor fin.

Embodiments of the invention are directed to a method of forming semiconductor devices on a wafer, wherein the method provides a buried contact in the fin-to-fin space of VFETs that connects the bottom S/D of the transistors to a buried power rail. A non-limiting example of the method includes forming a buried power rail in a buried oxide layer of a first substrate. A second substrate is formed on the buried oxide layer and first and second semiconductor fins are formed on the second substrate. A surface of the buried power rail in a fin-to-fin space is exposed. A buried via is formed on the exposed surface of the buried power rail. The buried via electrically couples the buried power rail to a bottom source or drain region of the first semiconductor fin.

Embodiments of the invention are directed to an integrated circuit (IC). A non-limiting example of the IC includes a first semiconductor fin and a second semiconductor fin separated by a fin-to-fin space. A buried power rail is encapsulated in a buried oxide layer and a buried via is formed on the buried power rail in the fin-to-fin space. The buried via electrically couples the buried power rail to a bottom S/D region of the first semiconductor fin.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
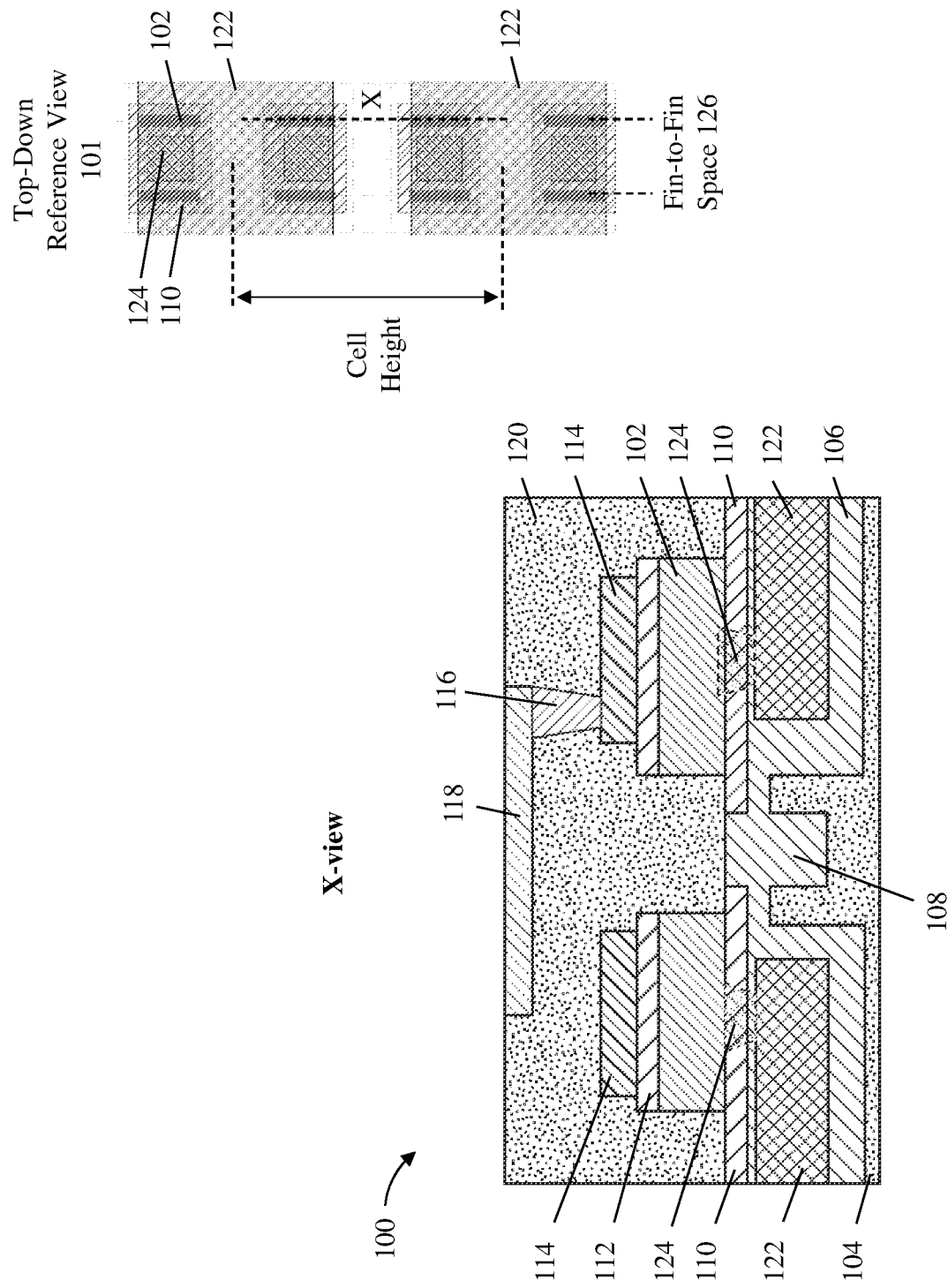
FIG. 1 depicts a cross-sectional view of a front-end-of-line (FEOL) region of an integrated circuit (IC) wafer during FEOL fabrication operations for forming vertical transport field effect transistors (VFETs) on the wafer according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

The present disclosure relates to providing buried contacts in the fin-to-fin space of vertical transport field effect transistors (VFETs) to connect the bottom source/drain (S/D) of the transistors to a buried power rail. While primarily discussed with respect to VFETs, it is understood in advance that embodiments of the invention are not limited to the particular transistor architectures or materials described in this specification. Rather, embodiments of the present invention are capable of being implemented in conjunction with any other type of transistor architecture (e.g., FinFETs, nanosheet FETs, etc.) using materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

The continued scaling of semiconductor devices has resulted in challenging fabrication requirements, especially when fabricating ever smaller transistors. Advanced FEOL processes incorporate phase-shifting, optical proximity correction, and other practices to satisfy these scaling demands, and can achieve critical dimensions (CDs) below 20 nm.

However, some challenges in fabricating advanced nonplanar transistors remain. For example, highly scaled VFET architectures often rely on reducing cell height to achieve cell area reduction. Under certain ground rules, however, scaling the cell height will cause a reduction in fin length, which will result in a decrease of effective gate length (Weff) per footprint area. One solution is to relocate the power rail to a bottom portion of the VFET, which can save area for longer fin lengths. For example, the power rail can be pushed down (buried) into the isolation region (e.g., a shallow trench isolation region) at the cell boundary. Doing so raises two major challenges. First, this approach limits the size of the power rail, which prefers a large critical dimension (CD) for better voltage drop along wires and electromigration. Second, the buried power rail needs a contact from the top of the VFET to connect the power rail and bottom source/drain (S/D). The buried power rail contact will itself consume area, mitigating the area saving benefits that would otherwise be achieved.

Turning now to an overview of aspects of the present invention, one or more embodiments of the invention address the above-described shortcomings of the prior art by providing a new semiconductor structure and a method for providing buried contacts in the fin-to-fin space of VFETs to connect the bottom S/D of the transistors to a buried power rail. Placing the buried contacts in the fin-to-fin space allows for the buried contact to be placed in a manner that is self-aligned to the fins. Advantageously, positioning a buried contact and buried power rail in this manner leverages the area below the active fin without consuming valuable topside area, saving area for a longer fin if desired.

Turning now to a more detailed description of aspects of the present invention, FIGS. 1-9 depict cross-sectional views of IC wafers 100, 200, 400, 500, 600, and 700 after fabrication operations in accordance with aspects of the invention. Although the cross-sectional diagrams depicted in FIGS. 1-9 are two-dimensional, it is understood that the diagrams depicted in FIGS. 1-9 represent three-dimensional structures. To assist with visualizing the three-dimensional features, the top-down reference view 101 shown in FIG. 1 provides a reference point for the cross-sectional views (X-view) shown in FIGS. 1-9. The X-view depicts a side cross-sectional view taken across the fins 102.

FIG. 1 depicts a cross-sectional view of a FEOL region of an IC wafer 100 during fabrication operations for forming VFETs on the IC wafer 100 according to one or more embodiments of the invention. At the fabrication stage depicted in FIG. 1, known fabrication operations have been used to form fins 102 over a substrate 104, configured and arranged as shown. The fins 102 can be formed over the substrate 104 using known FEOL VFET fabrication techniques. While the semiconductor structure 100 is shown having two fins 102 for ease of illustration, it is understood that any number of fins can be formed over or in the substrate 104. For example, the top-down reference view 101 depicts 8 fins arranged in pairs.

The fins 102 and the substrate 104 can be made of any suitable semiconductor materials, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 and the fins 102 can be made of a same semiconductor material. In other embodiments of the invention, the substrate 104 can be made of a first semiconductor material, and the fins 102 can be made of a second semiconductor material. In some embodiments of the invention, the substrate 104 and the fins 102 can be made of silicon or SiGe. In some embodiments of the invention, the substrate 104 is a silicon substrate and the fins 102 are silicon germanium fins having a germanium concentration of about 10 to about 80 percent. The fins 102 can each have a height ranging from 4 nm to 150 nm. In some embodiments of the present invention, the fins 102 are formed to a height of about 60 nm, although other fin heights are within the contemplated scope of the invention.

In some embodiments of the invention, the substrate 104 can include a buried oxide layer 106. The buried oxide layer can be made of any suitable dielectric material, such as, for example, a silicon oxide. In some embodiments of the invention, the buried oxide layer 106 is formed to a thickness of about 145 nm, although other thicknesses are within the contemplated scope of the invention.

In some embodiments of the invention, a shallow trench isolation (STI) region 108 can be formed in the substrate 104. The STI region 108 provides electrical isolation between adjacent devices (e.g., fins 102) on the substrate 104. The STI region 108 can be formed by forming a trench (not separately shown) in the substrate 104 and filling the trench with dielectric material, such as, for example, a low-k dielectric, an oxide, a nitride, silicon nitride, silicon oxide, SiON, SiC, SiOCN, and SiBCN.

In some embodiments of the invention, each of the fins 102 can be formed on a bottom source/drain (S/D) region 110 and a top S/D region 112 can be formed on a top surface of the fins 102. In some embodiments of the invention, the S/D regions 110, 112 can be epitaxially grown using, for example, vapor-phase epitaxy (VPE), molecular beam epitaxy (MBE), liquid-phase epitaxy (LPE), or other suitable processes. The S/D regions 110, 112 can include semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the S/D regions 110, 112 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

In some embodiments of the invention, the bottom S/D region 110 is made of silicon, while the top S/D region 112 is made of silicon germanium, or vice versa. In some embodiments of the invention, the bottom S/D region 110 is doped with an n-type dopant, such as phosphorus and the top S/D region 112 is doped with a p-type dopant, such as boron, or vice versa. In some embodiments of the invention, one of the S/D regions 110, 112 is a source, while the other is a drain. Current flows vertically through each of the fins 102 between the source and drain.

In some embodiments of the invention, contacts 114 (top contacts, fin contacts) are formed on the top S/D region 112. The contacts 114 can be made of any suitable conductive material, such as, for example, metals (e.g., tungsten, titanium, tantalum, ruthenium, zirconium, cobalt, copper, aluminum, lead, platinum, tin, silver, gold), conducting metallic compound materials (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. In some embodiments of the invention, the contacts 114 are electrically coupled to one or more vias 116 and lines 118 in a dielectric layer 120 (also referred to as an interlayer dielectric). The vias 116 and lines 118 can be made of any suitable conductive material, such as those for the contacts 114. The dielectric layer 120 can be made of any suitable dielectric material, such as, for example, silicon oxide.

As further shown in FIG. 1, a buried power rail 122 can be formed in the buried oxide layer 106. In some embodiments of the invention, the buried power rail 112 extends beneath a bottom surface of the fins 102. The buried power rail 122 can be made of any suitable conductive material, such as, for example, metals (e.g., tungsten, titanium, tantalum, ruthenium, zirconium, cobalt, copper, aluminum, lead, platinum, tin, silver, gold), conducting metallic compound materials (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials.

In some embodiments of the invention, a buried via 124 (buried contact, buried power rail via) is formed in the fin-to-fin space 126 between adjacent fins of the fins 102 (see top-down reference view 101). Note that the buried via 124 depicted in the cross-sectional view of FIG. 1 is shown by projection only to better demonstrate the positional relationship between the buried via 124, the fins 102, and the buried power rail 122. The buried via 124 can be formed of any suitable conductive material in a similar manner as the contacts 114.

Figure 2:
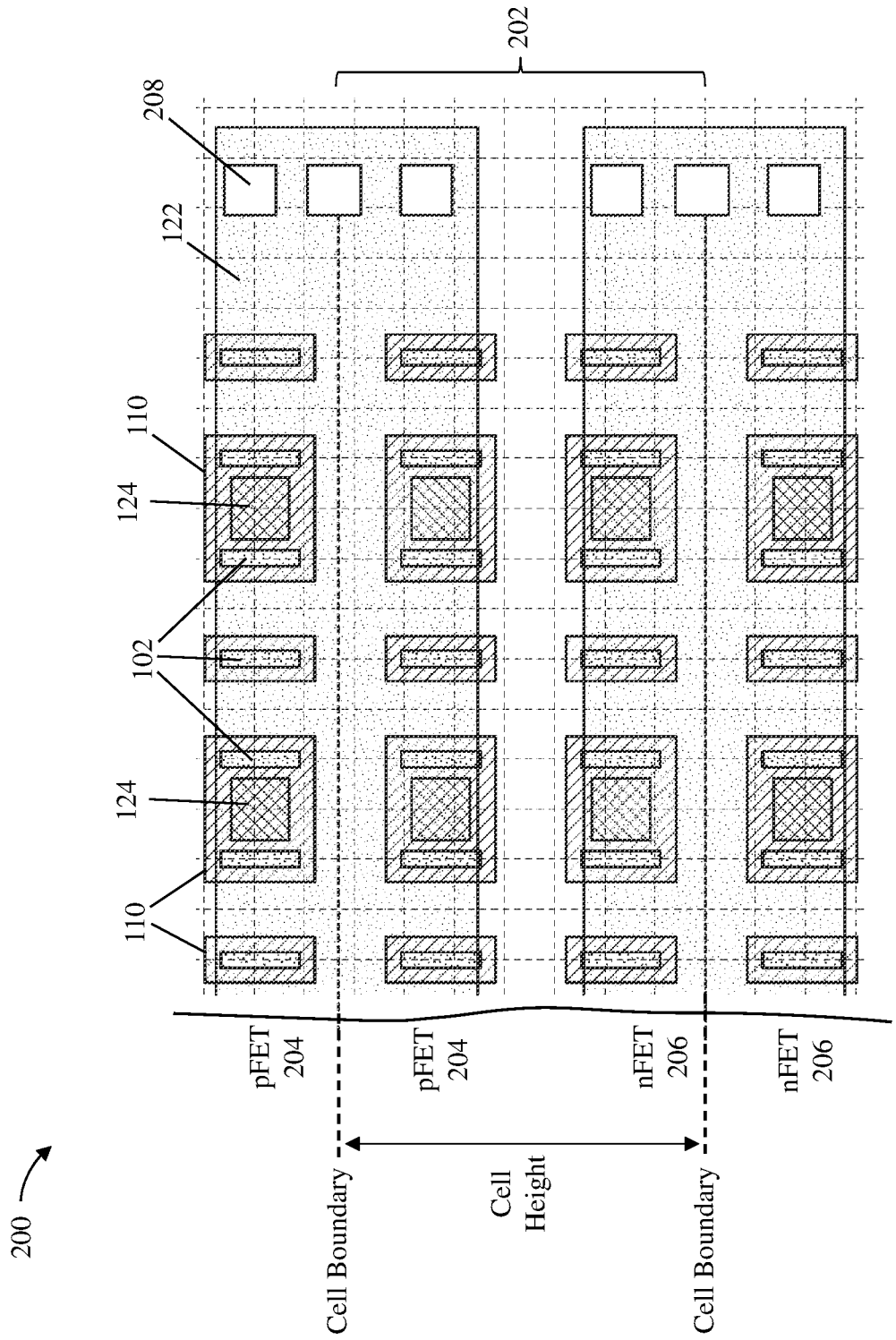
FIG. 2 depicts a top-down view of an IC wafer after a processing operation according to one or more embodiments of the invention.

FIG. 2 depicts a top-down view of an IC wafer 200 during fabrication operations for forming VFETs on the IC wafer 200 according to one or more embodiments of the invention. The IC wafer 200 can include fins 102, bottom S/D regions 110, buried power rails 122, buried vias 124 formed in a similar manner as disused with respect to FIG. 1. As shown in FIG. 2, a portion of the fins 102 can be arranged into cells 202 having a pFET region 204 and an nFET region 206. In some embodiments of the invention, power tabs 208 (power vias, power contacts)) are formed on the buried power rails 122. In some embodiments of the invention, the power tabs 208 electrically couple the buried power rails 122 to a power source (e.g., VDD rail, not separately shown).

Figure 3:
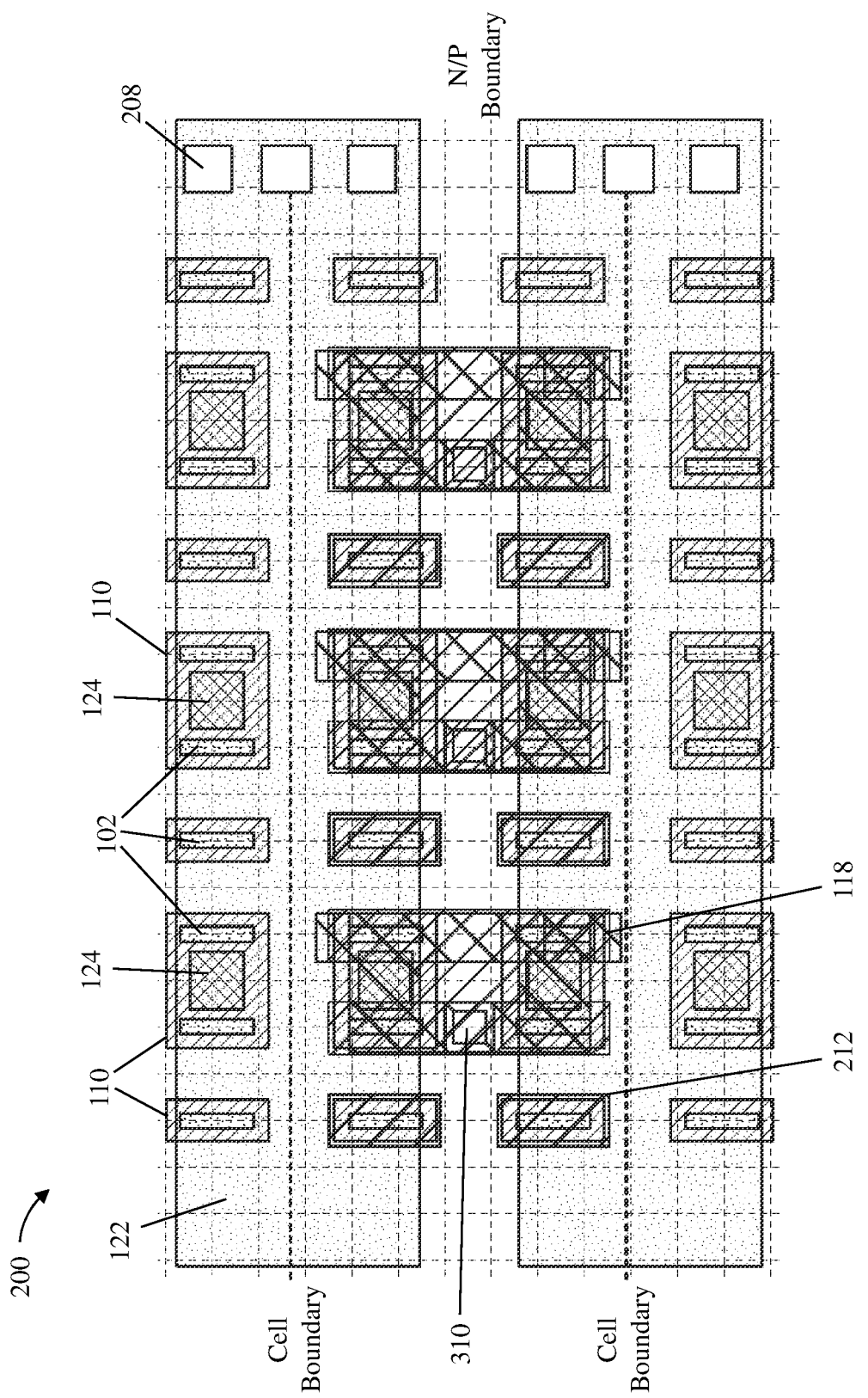
FIG. 3 depicts a top-down view of the IC wafer 200 that illustrates additional layers of the IC wafer formed according to one or more embodiments of the invention.
Figure 4:
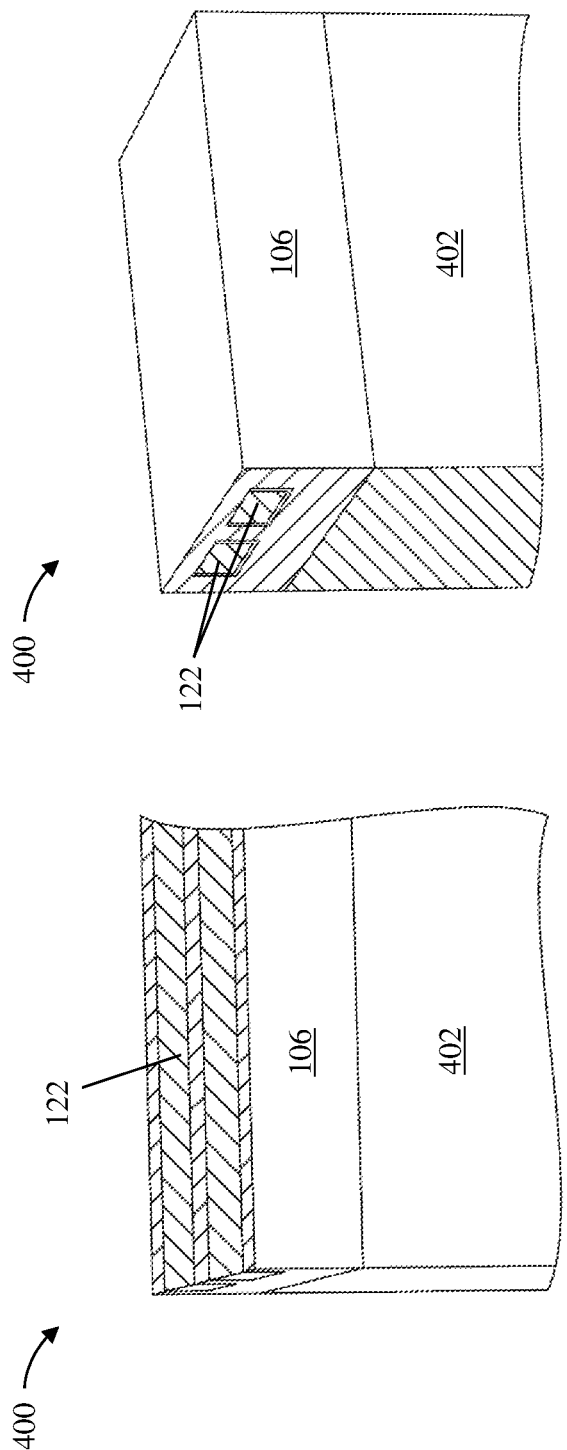
FIG. 4A depicts a cross-sectional isometric view of an IC wafer during fabrication operations for forming VFETs on the IC wafer according to one or more embodiments of the invention.
FIG. 4B depicts a cross-sectional isometric view of the IC wafer during fabrication operations for forming VFETs on the IC wafer according to one or more embodiments of the invention.

FIG. 3 depicts a top-down view of the IC wafer 200 that illustrates additional layers of the IC wafer 200 formed according to one or more embodiments of the invention. As shown in FIG. 3, the IC wafer 200 can further include lines 118 (e.g., M1 metallization lines), gate contacts 310, and gate 212. The gate contacts 310 can be formed in a similar manner and from similar conductive materials as the contacts 114 discussed with respect to FIG. 1.

FIGS. 4A and 4B depict cross-sectional isometric views of an IC wafer 400 during fabrication operations for forming VFETs on the IC wafer 400 according to one or more embodiments of the invention. At the fabrication stage depicted in FIG. 4A, the buried oxide layer 106 is formed on a substrate 402. In some embodiments of the invention, the IC wafer 400 is a first wafer of a two-wafer bonding process (see FIGS. 6A and 6B). The substrate 402 can be formed from same or similar semiconductor materials as the substrate 104 discussed with respect to FIG. 1.

In some embodiments of the invention, the buried power rail 122 is formed in the buried oxide layer 106. In some embodiments of the invention, the buried power rail 122 is formed by depositing conductive materials into a damascene trench (not separately shown). Conductive materials can include metals (e.g., Ru), alloys, or other conductive materials. In some embodiments of the invention, conductive materials overfill the damascene trench, forming overburdens that can be removed using, for example, chemical-mechanical planarization (CMP).

As shown in FIG. 4B, additional dielectric material is added to the buried oxide layer 106 to encapsulate the buried power rail 122. In some embodiments of the invention, an additional 20 nm to 30 nm of dielectrics (e.g., oxides, silicon oxides) are formed or deposited over the buried power rail 122, although other thicknesses are within the contemplated scope of the disclosure.

Figure 5:
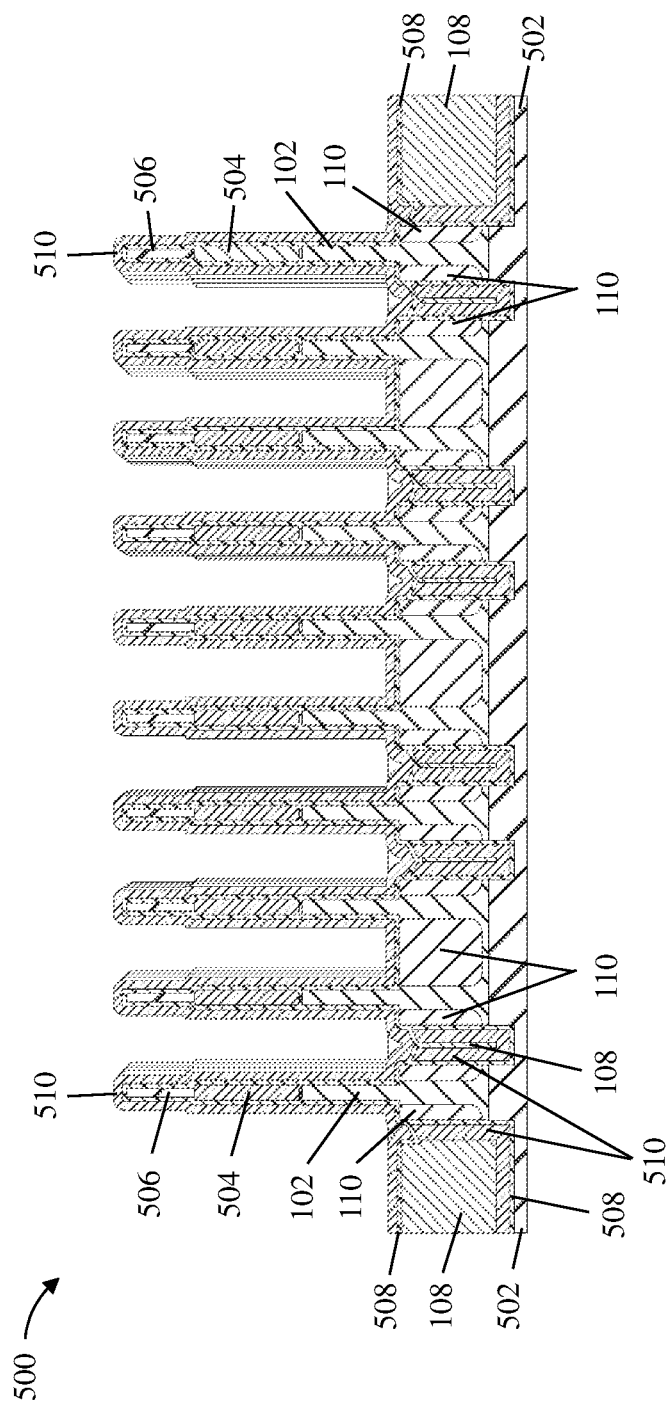
FIG. 5 depicts a cross-sectional view of an IC wafer during fabrication operations for forming VFETs on the IC wafer according to one or more embodiments of the invention.

FIG. 5 depicts a cross-sectional view of an IC wafer 500 during fabrication operations for forming VFETs on the IC wafer 500 according to one or more embodiments of the invention. In some embodiments of the invention, the IC wafer 500 is a second wafer of a two-wafer bonding process (see FIGS. 6A and 6B). At the fabrication stage depicted in FIG. 5, known fabrication operations have been used to form fins 102, STI region 108, and a bottom S/D region 110, configured and arranged as shown. The fins 102, STI region 108, and bottom S/D region 110 can be formed in a similar manner as described with respect to FIG. 1.

In some embodiments of the invention, the fins 102 are formed over a dielectric layer 502. In some embodiments of the invention, the dielectric layer 502 is an oxide, such as, for example, silicon oxide. In some embodiments of the invention, the dielectric layer 502 is formed over a substrate (not separately shown). The substrate can be a bulk substrate (e.g., bulk silicon) or a silicon-on-insulator (SOI) substrate formed using known processes.

In some embodiments of the invention, a hard mask 504 is patterned over a top surface of the fins 102. The hard mask 504 can be formed using any suitable process, such as, for example, chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process. The hard mask 504 can be made of any suitable dielectric material, such as, for example, a low-k dielectric, a nitride, silicon nitride, silicon oxide, SiON, SiC, SiOCN, or SiBCN. In some embodiments of the invention, the hard mask 504 is a silicon nitride hard mask.

In some embodiments of the invention, a second hard mask 506 is formed on the hard mask 504. The hard mask 506 can be formed in a similar manner as the hard mask 504. In some embodiments of the invention, the hard mask 506 includes an oxide, such as, for example, silicon oxide, although other dielectric materials are within the contemplated scope of the disclosure.

As further shown in FIG. 5, a liner 508 can be formed over the fins 102 and the hard masks 504, 506. In some embodiments of the invention, the liner 508 is conformally deposited using, for example, CVD. The liner 508 can be formed to a thickness of about 1 to 15 nm, although other thicknesses are within the contemplated scope of the disclosure. In some embodiments of the invention, the liner 508 is an oxide liner, for example, a silicon oxide liner.

In some embodiments of the invention, a second liner 510 can be formed over the first liner 508. In some embodiments of the invention, the liner 510 is conformally deposited using, for example, CVD. The liner 510 can be formed to a thickness of about 1 to 15 nm, although other thicknesses are within the contemplated scope of the disclosure. In some embodiments of the invention, the liner 510 is a nitride liner, for example, a silicon nitride liner.

Figure 6:
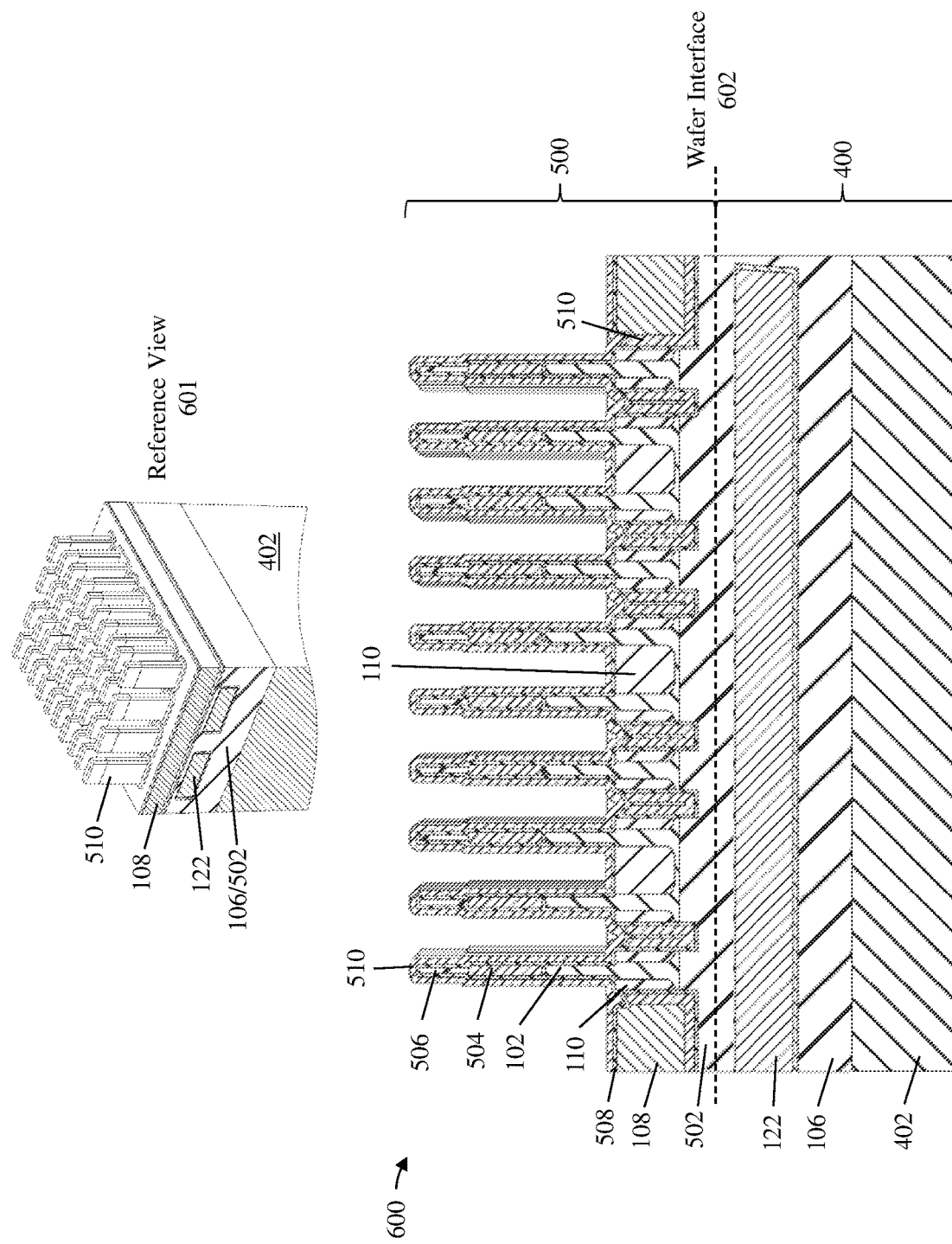
FIG. 6 depicts a cross-sectional view of an IC wafer after wafer bonding according to one or more embodiments of the invention.

FIG. 6 depicts a cross-sectional view of an IC wafer 600 after wafer bonding according to one or more embodiments of the invention. In some embodiments of the invention, the IC wafer 600 is a bonded wafer that includes a wafer interface 602 between the IC wafer 400 and the IC wafer 500. The IC wafers 400, 500 can be bonded using known wafer bonding techniques. Reference view 601 depicts an isometric view of the IC wafer 600.

Figure 7:
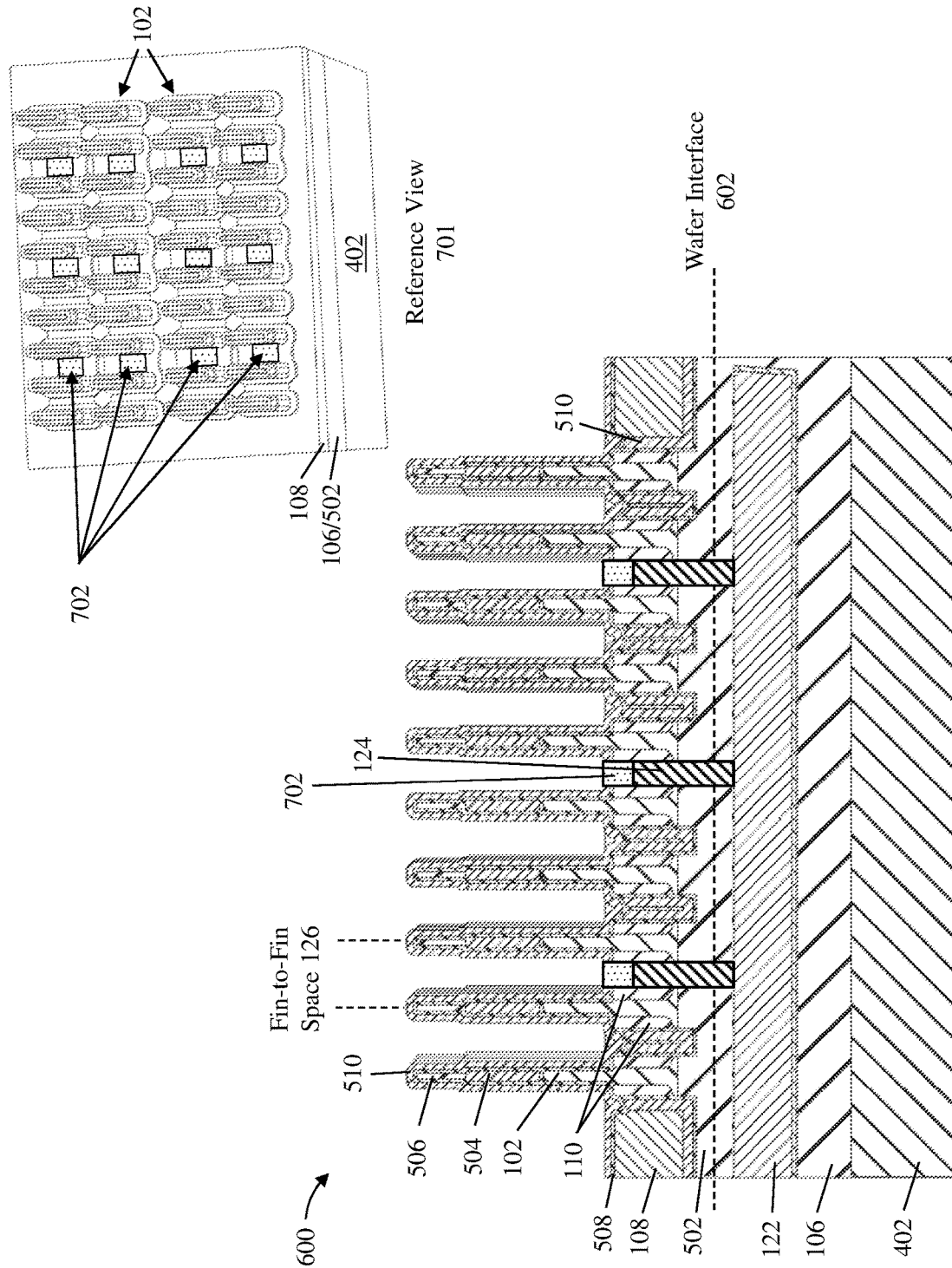
FIG. 7 depicts a cross-sectional view of the IC wafer after a processing operation according to one or more embodiments of the invention.

FIG. 7 depicts a cross-sectional view of the IC wafer 600 after a processing operation according to one or more embodiments of the invention. In some embodiments of the invention, a buried via 124 is formed on a surface of the buried power rail 122 in the fin-to-fin space 126. The buried via 124 serves to electrically couple the bottom S/D 110 to a current source (e.g., a VDD rail, not shown) through the buried power rail 122.

In some embodiments of the invention, portions of the liners 508, 510 are removed in the fin-to-fin space 126 to expose a surface of the bottom S/D region 110. Portions of the liners 508, 510 can be removed using known processes, such as a wet etch, a dry etch, or a combination of sequential wet and/or dry etches.

In some embodiments of the invention, the exposed portions of the bottom S/D region 110, bottom portions of the fins 102 (i.e., those portions under the bottom S/D region 110) and portions of the dielectric layers 502, 106 at the wafer interface 602 are removed to expose a surface of the buried power rail 122. Portions of the bottom S/D region 110, fins 102, and dielectric layers 502, 106 can be removed using known processes, such as a wet etch, a dry etch, or a combination of sequential wet and/or dry etches.

Once the surface of the buried power rail 122 is exposed, conductive materials can be formed or deposited therein to define the buried via 124. As discussed previously, the buried via 124 can include a range of conductive materials, such as, for example, ruthenium. In some embodiments of the invention, a dielectric cap 702 is formed on the buried via 124. The dielectric cap 702 can be made from any suitable dielectric material, such as, for example, silicon oxide. The dielectric cap 702 serves to electrically isolate the buried via 124 and the buried power rail 122 from the gate 802 (see FIG. 8). In some embodiments of the invention, dielectric material is deposited over the IC wafer 600 and recessed to define the dielectric cap 702. Reference view 701 depicts an isometric view of the IC wafer 600 illustrating the positioning of the dielectric cap 702 relative to the fins 102.

Figure 8:
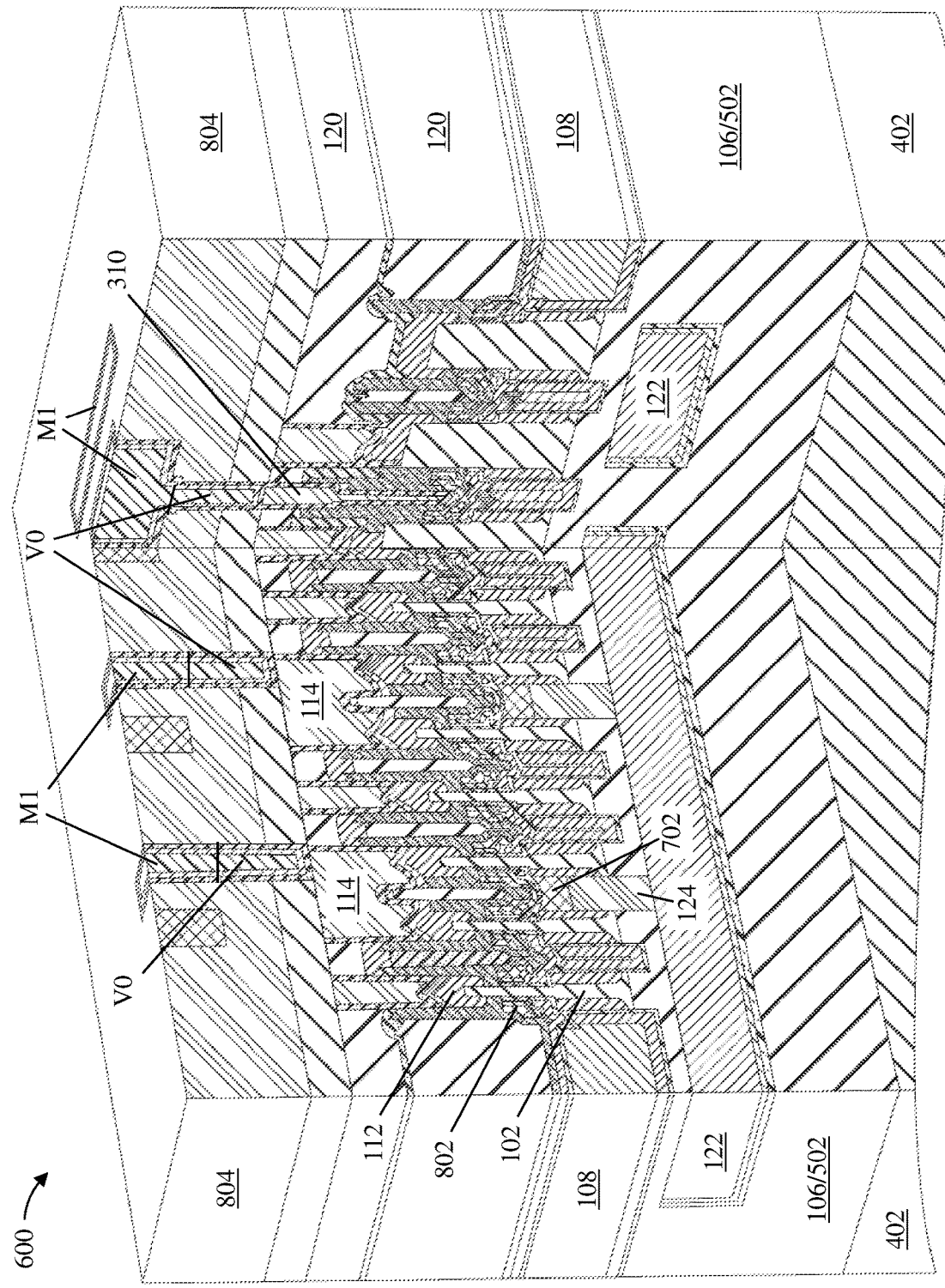
FIG. 8 depicts a cut-away isometric view of the IC wafer after completion of FEOL, middle-of-line (MOL), and back-end-of-line (BOEL) processing operations according to one or more embodiments of the invention.

FIG. 8 depicts a cut-away isometric view of the IC wafer 600 after completion of FEOL, MOL, and BOEL processing operations according to one or more embodiments of the invention. In some embodiments of the invention, downstream processes continue using known FEOL, MOL, and BEOL VFET fabrication techniques to create a final, operational device. For example, gates 802 (e.g., high-k metal gates, HKMG, including gate dielectrics and work function metals), various dielectrics (e.g., dielectric layer 120, low-k dielectric layer 804), top S/D region 112, contacts 114, 310, and metallization layers V0 and M1 can be fabricated using known VFET integration processes. Other structural elements, such as additional metallization layers (e.g., V1, M2, etc.), are omitted for clarity.

Figure 9:
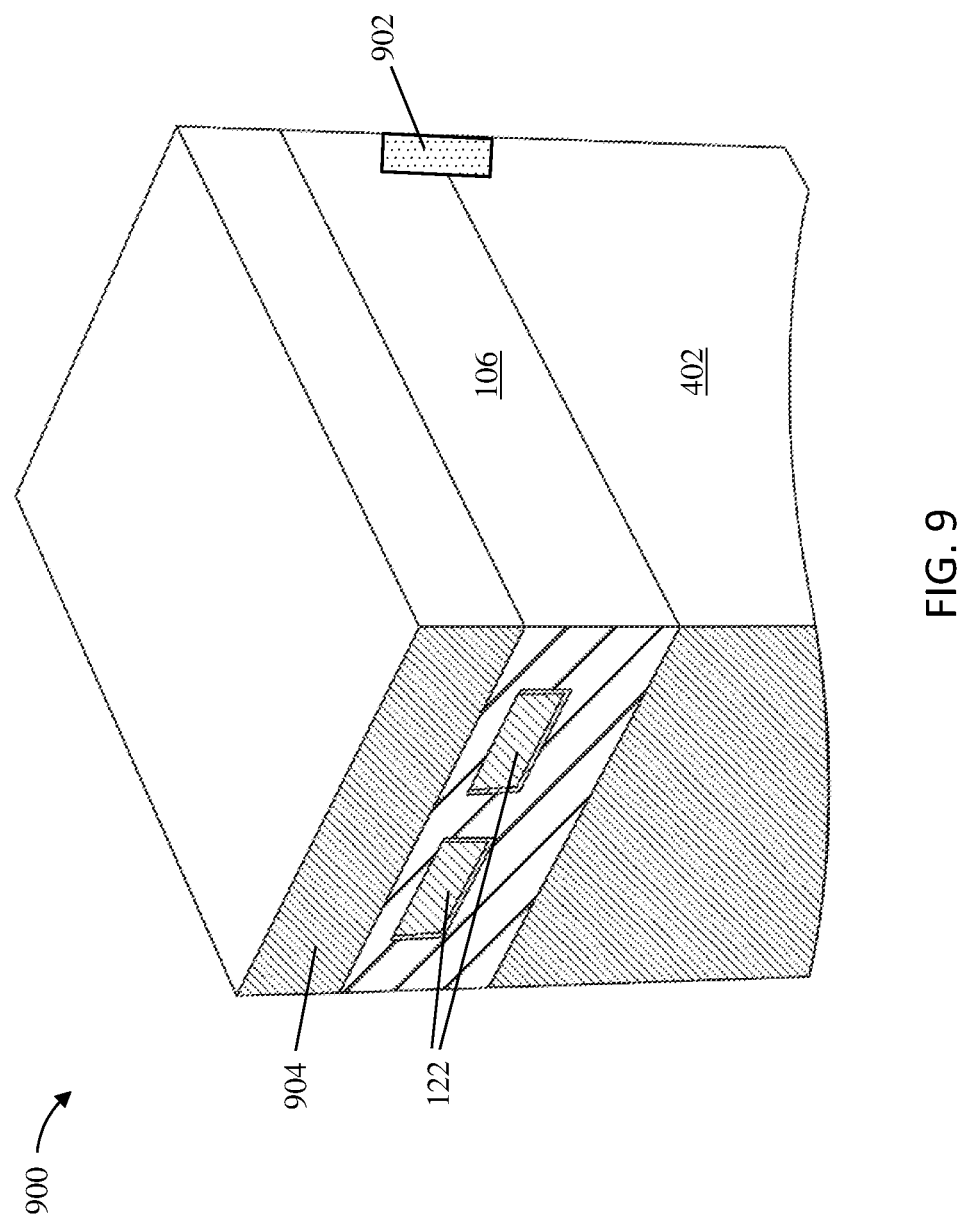
FIG. 9 depict a cross-sectional view of an IC wafer during fabrication operations for forming VFETs on the IC wafer according to one or more embodiments of the invention.

FIG. 9 depict a cross-sectional isometric view of an IC wafer 900 during fabrication operations for forming VFETs on the IC wafer 900 according to one or more embodiments of the invention. FIG. 9 depicts an alternative single wafer process flow which follows generally from the flow described with respect to FIGS. 4A and 4B, except for the insertion of an alignment mark 902 in the buried oxide layer 106 and/or the substrate 402. After additional dielectric material is added to the buried oxide layer 106 to encapsulate the buried power rail 122 (see FIG. 4B), a second substrate 904 is bonded to a surface of the buried oxide layer 106. The second substrate 904 can be bonded to the buried oxide layer 106 using known wafer bonding processes. The second substrate 904 can include a same or different semiconductor material than the substrate 402.

Once the second substrate 904 is formed, downstream FEOL, MOL, and BEOL processes can continue as previously described. In other words, instead of continuing to FIG. 5, where various fins 102 are formed on a separate IC wafer 500 (as follows FIG. 4B), the fins 102 and other device elements are formed directly on the second substrate 902. In some embodiments of the invention, the alignment mark 902 is exposed (e.g., at the wafer edge, etc.) and leveraged to align the fins 102 and other device elements over the substrate 402 and the buried power rail 122.

Figure 10:
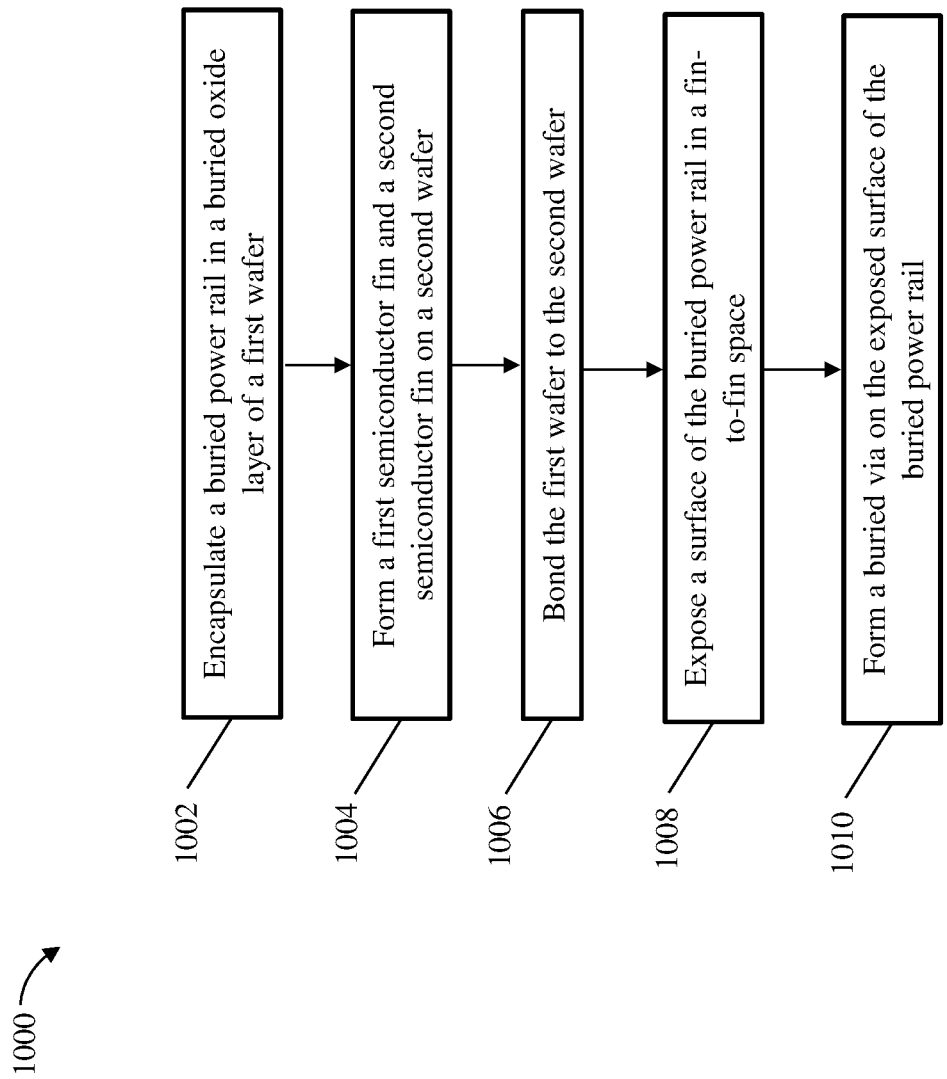
FIG. 10 depicts a flow diagram illustrating a method according to one or more embodiments of the invention.

FIG. 10 depicts a flow diagram 1000 illustrating a method for providing buried contacts in the fin-to-fin space of VFETs to connect the bottom S/D of the VFETs to a buried power rail according to one or more embodiments of the invention. As shown at block 1002, a buried power rail is encapsulated in a buried oxide layer of a first wafer. In some embodiments of the invention, encapsulating the buried power rail includes forming the buried oxide layer over a substrate of the first wafer, forming the buried power rail in a trench in the buried oxide layer, and depositing additional dielectric material over the buried power rail. In some embodiments of the invention, the buried power rail is electrically coupled to a current source (e.g., a VDD rail).

At block 1004, a first semiconductor fin and a second semiconductor fin are formed on a second wafer. In some embodiments of the invention, the first semiconductor fin and the second semiconductor fin are separated by a fin-to-fin space. In some embodiments of the invention, the second wafer includes a second buried oxide layer.

At block 1006, the first wafer is bonded to the second wafer. In some embodiments of the invention, a wafer interface between the first wafer and the second wafer is between the buried oxide layer and the second buried oxide layer. In some embodiments of the invention, the buried power rail extends under the first semiconductor fin and the second semiconductor fin.

At block 1008, a surface of the buried power rail in the fin-to-fin space is exposed. At block 1010, a buried via is formed on the exposed surface of the buried power rail. In some embodiments of the invention, the buried via electrically couples the buried power rail to a bottom source or drain region of the first semiconductor fin.

The method can further include forming a dielectric cap on the buried via. In some embodiments of the invention, the dielectric cap electrically isolates the buried via from a gate of one or both of the first semiconductor fin and the second semiconductor fin.

Figure 11:
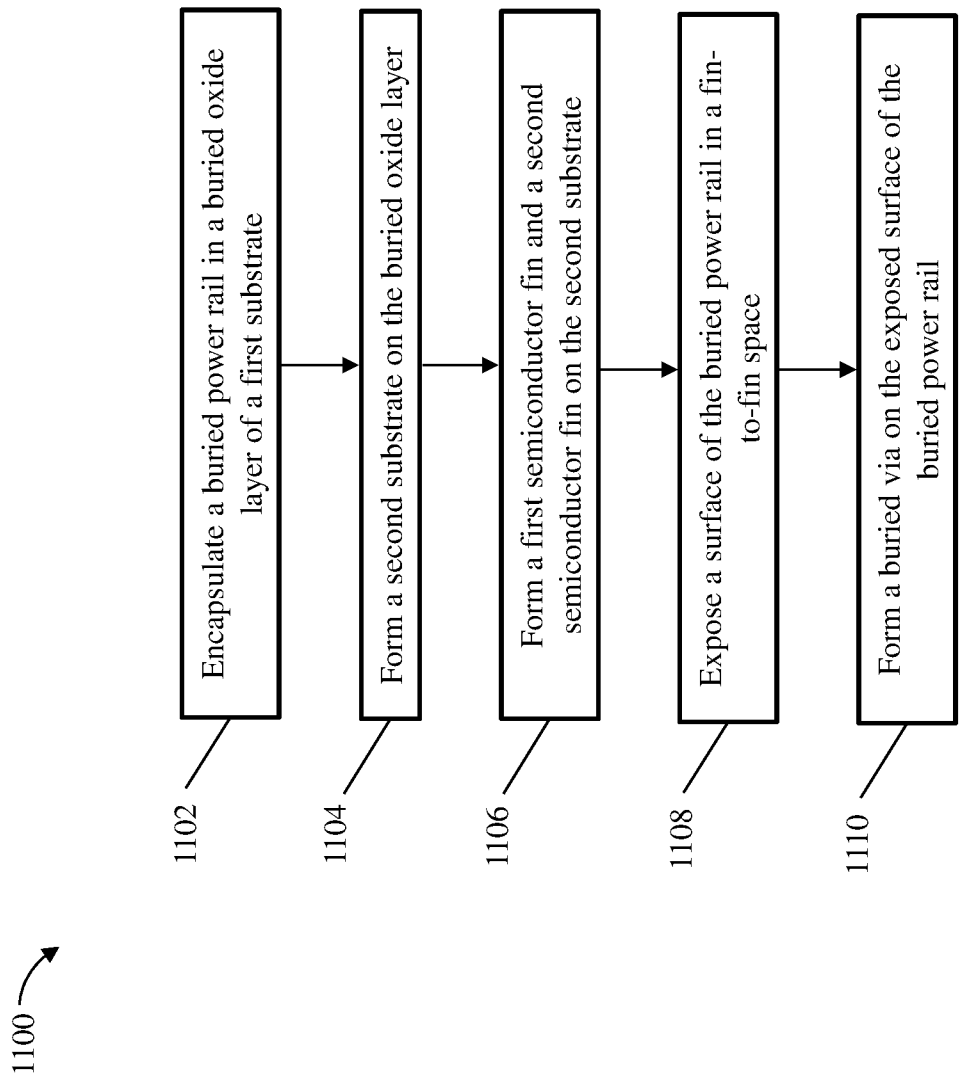
FIG. 11 depicts a flow diagram illustrating a method according to one or more embodiments of the invention.

FIG. 11 depicts a flow diagram 1100 illustrating a method for providing buried contacts in the fin-to-fin space of VFETs to connect the bottom S/D of the VFETs to a buried power rail according to one or more embodiments of the invention. As shown at block 1102, a buried power rail is encapsulated in a buried oxide layer of a first substrate.

At block 1104, a second substrate is formed on the buried oxide layer. At block 1106, a first semiconductor fin and a second semiconductor fin are formed on the second substrate. In some embodiments of the invention, the first semiconductor fin and the second semiconductor fin are separated by a fin-to-fin space.

At block 1108, a surface of the buried power rail is exposed in the fin-to-fin space. At block 1110, a buried via is formed on the exposed surface of the buried power rail. In some embodiments of the invention, the buried via electrically couples the buried power rail to a bottom source or drain region of the first semiconductor fin.

The method can further include forming an alignment mark formed in one or both of the buried oxide layer and the first substrate. In some embodiments of the invention, the alignment mark is leveraged to align the first semiconductor fin and the second semiconductor fin to the buried power rail.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming an integrated circuit, the method comprising:
    encapsulating a buried power rail in a buried oxide layer of a first wafer;
    forming a first semiconductor fin and a second semiconductor fin on a second wafer, wherein the first semiconductor fin and the second semiconductor fin are separated by a fin-to-fin space;
    bonding the first wafer to the second wafer at a wafer interface;
    exposing a surface of the buried power rail in the fin-to-fin space; and
    forming a buried via on the exposed surface of the buried power rail, wherein the buried via electrically couples the buried power rail to a bottom source or drain region of the first semiconductor fin, the buried via extending through the wafer interface.

2. The method of claim 1, wherein the second wafer comprises a second buried oxide layer.

3. The method of claim 2, wherein the wafer interface between the first wafer and the second wafer is between the buried oxide layer and the second buried oxide layer.

4. The method of claim 1 further comprising forming a dielectric cap on the buried via.

5. The method of claim 4, wherein the dielectric cap electrically isolates the buried via from a gate of the first semiconductor fin.

6. The method of claim 1, wherein the buried power rail extends under the first semiconductor fin and the second semiconductor fin.

7. The method of claim 1, wherein encapsulating the buried power rail comprises:
    forming the buried oxide layer over a substrate of the first wafer;
    forming the buried power rail in a trench in the buried oxide layer; and
    depositing additional dielectric material over the buried power rail.

8. A method for forming an integrated circuit, the method comprising:

encapsulating a buried power rail in a buried oxide layer of a first substrate;

forming a second substrate on the buried oxide layer at a wafer interface;

forming a first semiconductor fin and a second semiconductor fin on the second substrate, wherein the first semiconductor fin and the second semiconductor fin are separated by a fin-to-fin space;

exposing a surface of the buried power rail in the fin-to-fin space; and forming a buried via on the exposed surface of the buried power rail, wherein the buried via electrically couples the buried power rail to a bottom source or drain region of the first semiconductor fin, the buried via extending through the wafer interface.

9. The method of claim 8 further comprising an alignment mark formed in one or both of the buried oxide layer and the first substrate.

10. The method of claim 9, wherein the alignment mark is leveraged to align the first semiconductor fin and the second semiconductor fin to the buried power rail.

11. The method of claim 8 further comprising forming a dielectric cap on the buried via.

12. The method of claim 11, wherein the dielectric cap electrically isolates the buried via from a gate of the first semiconductor fin.

13. The method of claim 8, wherein the buried power rail extends under the first semiconductor fin and the second semiconductor fin.

14. The method of claim 8, wherein encapsulating the buried power rail comprises:

forming the buried oxide layer over a substrate of the first wafer;

forming the buried power rail in a trench in the buried oxide layer; and depositing additional dielectric material over the buried power rail.

* * * * *